US010429461B2

(12) United States Patent
Taniguchi et al.

(10) Patent No.: US 10,429,461 B2
(45) Date of Patent: Oct. 1, 2019

(54) MAGNETIC RESONANCE IMAGING DEVICE AND TIMING MISALIGNMENT DETECTION METHOD THEREOF

(71) Applicant: Hitachi, Ltd., Tokyo (JP)

(72) Inventors: Yo Taniguchi, Tokyo (JP); Masahiro Takizawa, Tokyo (JP); Takeshi Yatsuo, Tokyo (JP); Atsushi Kuratani, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1113 days.

(21) Appl. No.: 14/760,846

(22) PCT Filed: Dec. 4, 2013

(86) PCT No.: PCT/JP2013/082608
§ 371 (c)(1),
(2) Date: Jul. 14, 2015

(87) PCT Pub. No.: WO2014/112235
PCT Pub. Date: Jul. 24, 2014

(65) Prior Publication Data
US 2016/0025824 A1      Jan. 28, 2016

(30) Foreign Application Priority Data

Jan. 16, 2013  (JP) .................................. 2013-005069

(51) Int. Cl.
*G01R 33/385*      (2006.01)
*G01R 33/58*       (2006.01)
(Continued)

(52) U.S. Cl.
CPC ... *G01R 33/3852* (2013.01); *G01R 33/56572* (2013.01); *G01R 33/58* (2013.01); *G01R 33/546* (2013.01)

(58) Field of Classification Search
USPC ........................ 324/300–322; 600/407–435; 382/128–131
See application file for complete search history.

(56) References Cited

U.S. PATENT DOCUMENTS 5,180,982 A * 1/1993 Zeiger .............. G01R 33/34053
324/318
5,200,701 A * 4/1993 Siebold ................ G01R 33/385
324/309
(Continued)

FOREIGN PATENT DOCUMENTS

JP         9-94244 A      4/1997

OTHER PUBLICATIONS

International Search Report of PCT/JP2013/082608.

*Primary Examiner* — Melissa J Koval
*Assistant Examiner* — Tiffany A Fetzner
(74) *Attorney, Agent, or Firm* — Mattingly & Malur, PC

(57) ABSTRACT

A magnetic resonance imaging device produces a magnetic field gradient with parallel driving of positive-side subcoils and negative-side subcoils with different power sources in the magnetic field gradient direction, to detect a misalignment in drive timing of the positive side and the negative side. Pulse sequences for timing misalignment detection having a slice magnetic field gradient pulse and a read-out magnetic field gradient pulse in the same direction as a magnetic field gradient of interest are executed. A positive-side slice echo and a negative-side slice echo of the magnetic field gradient are acquired. A phase difference between a positive-side projection image and a negative-side projection image is derived by computation with phase error from other factors being removed. From the slope of the phase difference with respect to a location, the drive timing misalignment between the positive-side subcoil and the nega-
(Continued)

121 Positive-side subcoil
(102-11, 102-12) generated
magnetic field intensity
distribution 122: Negative-side subcoil
(102-13, 102-14) generated
magnetic field intensity
distribution 123: Combined magnetic field
intensity distribution tive-side subcoil of the magnetic field gradient production is detected.

10 Claims, 13 Drawing Sheets

(51) Int. Cl.
 *G01R 33/565* (2006.01)
 *G01R 33/54* (2006.01)

(56) References Cited

U.S. PATENT DOCUMENTS

| | | | | |
|---|---|---|---|---|
| 5,343,182 A * | 8/1994 | Ohta | ............ | G01R 33/3875 324/319 |
| 5,867,027 A | 2/1999 | Kawamoto | | |
| 6,384,604 B2 * | 5/2002 | Heid | ............ | G01R 33/3854 324/318 |
| 7,808,241 B2 * | 10/2010 | Dohata | ............ | G01R 33/34053 324/318 |
| 8,035,383 B2 * | 10/2011 | Ochi | ............ | G01R 33/34046 324/318 |
| 8,482,369 B2 * | 7/2013 | Wang | ............ | H01F 6/02 335/216 |
| 2001/0043070 A1 * | 11/2001 | Heid | ............ | G01R 33/3854 324/318 |
| 2008/0272784 A1 * | 11/2008 | Harvey | ............ | G01R 33/385 324/318 |
| 2009/0160441 A1 * | 6/2009 | Dohata | ............ | G01R 33/34053 324/309 |
| 2010/0033183 A1 * | 2/2010 | Ochi | ............ | G01R 33/34046 324/313 |
| 2013/0106545 A1 * | 5/2013 | Wang | ............ | H01F 6/02 335/216 |
| 2014/0300357 A1 * | 10/2014 | Bachschmidt | ... | G01R 33/56536 324/309 |
| 2016/0025824 A1 * | 1/2016 | Taniguchi | ......... | G01R 33/56572 324/309 |

* cited by examiner

121 Positive-side subcoil
(102-11, 102-12) generated
magnetic field intensity
distribution 122: Negative-side subcoil
(102-13, 102-14) generated
magnetic field intensity
distribution 123: Combined magnetic field
intensity distribution

FIG. 8

| ECHO NO. | SLICE MAGNETIC FIELD GRADIENT | EXCITATION FREQUENCY | SLICE POSITION | READ-OUT MAGNETIC FIELD GRADIENT |
|---|---|---|---|---|
| 1 | − | − | $+x_1$ | + |
| 2 | + | − | $-x_1$ | − |
| 3 | + | + | $+x_1$ | − |
| 4 | − | + | $-x_1$ | + |

ECHO MEASUREMENT ORDER

230: Water Phantom
231, 232: Positive, Negative Slice Positions

MAGNETIC RESONANCE IMAGING DEVICE AND TIMING MISALIGNMENT DETECTION METHOD THEREOF

TECHNICAL FIELD

The present invention relates to a magnetic resonance imaging technique, and more particularly, to an approach for detecting timing misalignment between the power sources for driving the magnetic field gradient coils so as to adjust the detected misalignment.

BACKGROUND ART

The magnetic resonance imaging (MRI) system is a medical image diagnostic device configured to apply a high frequency magnetic field and a magnetic field gradient to a subject laid in a static magnetic field, measure the signal generated from the subject through nuclear magnetic resonance, and form an image of the signal.

The magnetic field gradient intended to generate the one-dimensional magnetic field intensity distribution in a space around the subject is used for imparting the location information to the signal. Generally, the magnetic field gradient generator includes a coil and a power source for driving the coil. As it is necessary to impart three-dimensional location information, three coil groups and the power sources are prepared so that the magnetic field gradient is applied separately to the three orthogonal axes (x, y, z).

The power source with significantly high output is necessary for generating the magnetic field gradient required for photographing. For this, there is a driving method using combined power sources each with low output in parallel with one another (for example, refer to JP-A-9-94244). This method is configured to divide the coil of the respective axes into a plurality of subcoils so that the coils of the respective axes may be driven by a plurality of power sources. Accordingly, it is possible to generate sufficient magnetic field gradient even if the low-output power sources are separately employed.

Use of a plurality of power sources for driving may cause the problem of output timing misalignment among the respective power sources. Variance in characteristics of the power sources and the difference in impedance among subcoils may be the main cause of the timing misalignment. The timing misalignment further leads to the artifact and distortion in the photographed image. Adjustment has to be made to completely synchronize the respective power sources.

The adjustment method for synchronization employs the delay circuit for shifting the time for input waveform of the power source. One of the methods is configured to allow the ammeter to measure the current waveform flowing through the subcoil so that the differential waveform among the current waveforms becomes zero. Another method is configured to adjust the static magnetic field intensity at the center in the bore so as to prevent change in the intensity while monitoring the static magnetic field intensity (for example, refer to Japanese Unexamined Patent Application Publication No. Hei 9-94244).

CITATION LIST

Patent Literature

PTL 1: Japanese Unexamined Patent Application Publication No. Hei 9-94244

SUMMARY OF INVENTION

Technical Problem

There are various methods of dividing the magnetic field gradient coil into subcoils. The most severe problem to be noted may be found in the following case for driving the coils divided in the manner as described below. That is, the coil is divided into the subcoils or subcoil group having the maximum value of the generated magnetic field distribution at the positive-side location on the axis of the magnetic field gradient with positive polarity for generating the magnetic field which intensifies the static magnetic field, and the subcoils or subcoil group having the maximum value of the generated magnetic field distribution at the negative-side location on the axis of the magnetic field gradient with positive polarity for generating the magnetic field which attenuates the static magnetic field. The former subcoil will be referred to as the positive-side subcoil, and the latter subcoil will be referred to as the negative-side subcoil. The drive timing misalignment between the paired positive-side subcoil and the negative-side subcoil will cause the artifact in the photographed image. The size of the artifact caused by the timing misalignment mainly depends on the read-out sampling interval. For example, if the timing misalignment corresponds to about 5 samples, the phase distortion will occur in the image. If the timing misalignment corresponds to about 10 samples, the luminance may be changed. As the MRI has the shortest sampling interval of approximately several microseconds, it is necessary to suppress the timing misalignment to approximately 10 microseconds or less.

In the aforementioned time adjustment method, as the time misalignment is reduced, the differential waveform and change in the magnetic field intensity may be lessened to be at the same level as that of noise. It is therefore difficult for the method to detect the misalignment for the period as short as approximately 10 microseconds. There is a problem of difficulty in accurate detection of the center position in the bore. Furthermore, it is necessary to provide additional devices such as a large-capacity ammeter for measuring the current applied to the coil, and a magnetic field measuring device for measuring the static magnetic field intensity.

The present invention has been made in consideration of the aforementioned circumstances. It is an object of the present invention to provide a technique for accurately detecting the output timing misalignment between the respective power sources which are intended to perform parallel driving of the positive-side subcoils and the negative-side subcoils which are divided from the magnetic field gradient coil without employing the additional measurement device. It is an object of the present invention to provide an adjustment technique for correcting the output timing misalignment between the respective power sources so as to eliminate the phase distortion in the image caused by the misalignment without employing the additional measurement device.

Solution to Problem

The representative structure of the present invention serves to detect the time misalignment using projection images at the positive side and the negative side of the magnetic field gradient. The time misalignment may change phases of the projection images at the positive side and the negative side to be different from each other. The time misalignment is detected based on the resultant phase difference.

Specifically, the system employs the exclusive pulse sequence for timing misalignment detection, having the slice magnetic field gradient pulse in the same direction as the subject magnetic field gradient and the read-out magnetic field gradient. Especially, the pulse sequences derived from positive and negative shifting of the excitation frequency from the Lamor frequency corresponding to the static magnetic field intensity are used for the respective measurements to obtain two projection images reflecting the spins in the two slices at the positive and the negative locations of the magnetic field gradient, respectively. The computing device takes the phase difference through alignment between those two projection images to provide the slope of the phase difference with respect to the location. The photographing with the pulse sequence for detection will be performed a plurality of times by changing the drive timing of one of the positive-side subcoils and the negative-side subcoils by the predetermined time width. The computing device obtains the slope of the phase difference between two projection images with respect to the location from results of photographing performed a plurality of times. The time misalignment corresponding to the slope of the phase difference that becomes zero is computed in accordance with the obtained slope value. Specifically, the linear function fitting is performed by plotting the slope values of the phase difference of two projection images, which are derived from the respective photographing results in the two-dimensional space defined by the change in the drive timing of one of the subcoil groups, and the slope of the phase difference between two projection images. Then the amount of change in the drive timing corresponding to the slope value of the phase difference that becomes zero is estimated. In other words, the drive timing misalignment between the positive-side and the negative-side subcoils before adjustment is computed.

The drive timing misalignment between the positive-side subcoil and the negative-side subcoil is caused by deviation of a rise waveform and a fall waveform of the magnetic field gradient from those designed. Especially the deviation from the designed rise waveform of the read-out magnetic field gradient pulse may cause the shift of the appearance time of the echo. In the case of the injection image formed by applying inverse-Fourier transformation on the echo, such deviation appears as the primary phase change with respect to the projected location. Meanwhile, the deviation of the sampling timing of the echo signal reception may cause the primary phase change with respect to the location in the projection image of echo. In the case where the projection images reflecting the positive-side and negative-side slices in the magnetic field gradient are obtained by executing the timing misalignment detection pulse sequence, the primary phase change caused by the deviation of the sampling timing will appear on both the two projection images equivalently. The primary phase change caused by the drive timing misalignment between the positive side and the negative side of the magnetic field gradient serves to invert polarities of the projection image that reflects the positive-side slice and the projection image that reflects the negative-side slice in the magnetic field gradient. The timing misalignment detection pulse sequence is executed to provide the projection images that reflect both the positive-side and the negative-side slices in the magnetic field gradient, and further to provide the phase difference by aligning those two projection images so that the slope of the phase difference with respect to the location is obtained. Then the phase rotation caused by the signal sampling timing misalignment may be cancelled to allow correct extraction of the phase rotation corresponding to the drive timing misalignment between the positive side and the negative side in the magnetic field gradient.

The approach according to the present invention, which has been described so far is designed to cancel the phase rotation caused by the sampling timing misalignment of the signal which is mixed with the projection image of the spin echo, extract the phase rotation corresponding to the drive timing misalignment between the positive side and the negative side in the magnetic field gradient, and derive the amount of the drive timing misalignment between the positive side and the negative side in the magnetic field gradient. After specific examination, it has been found that the respective projection images are mixed with not only the primary phase change with respect to the location, but also the phase distribution unique to probe, and the phase distribution caused by ununiformity in the static magnetic field. Strictly, those phase distributions inhibit extraction of the phase rotation corresponding to the drive timing misalignment between the positive side and the negative side in the magnetic field gradient. In the approach according to the present invention, which has been further studied, the pulse sequence formed by combining the negative slice magnetic field gradient and the negatively shifted excitation frequency, and the pulse sequence formed by combining the positive slice magnetic field gradient and the positively shifted excitation frequency are executed to provide the projection images that reflect the spin in the slice at the respective positive-side locations, based on which the difference (first difference) between the projection images is computed. The pulse sequence formed by combining the positive slice magnetic field gradient and the negatively shifted excitation frequency, and the pulse sequence formed by combining the negative slice magnetic field gradient and the positively shifted excitation frequency are executed to provide the projection images reflecting the spin in the slice at the negative-side locations, based on which the difference (second difference) between the projection images is computed. The two projection images used for calculating the first difference reflect the spin of the slice at the identical positive positions. Accordingly, computation of the difference between the projection images serves to cancel the phase distribution unique to probe and the phase rotation caused by ununiformity in the static magnetic field. Similarly, the two projection images used for computing the second difference represents those, of the slice at the identical negative locations. Accordingly, computation of the difference serves to cancel the phase rotation caused by the phase distribution unique to probe, and ununiformity in the static magnetic field. Then the phase difference computing method is employed to obtain the phase difference by combining the slice positions corresponding to the first and the second differences. Likewise the representative example, the photographing is performed a plurality of times while changing the drive timing of one of the positive-side subcoils and the negative-side subcoils by the predetermined time width, and the slope of the phase difference between the first difference among the projection images of the positive-side slice, and the second difference among the projection images of the negative-side slice is obtained with respect to the location. The timing misalignment corresponding to the slope of the phase difference that becomes zero, that is, the drive timing misalignment between the positive-side and the negative-side subcoils before adjustment is computed. In this way, the approach of the present invention, which has been further examined is configured to cancel the primary phase change caused by the sampling timing misalignment of the signal mixed with the four respective projection images, the phase rotation caused by the phase distribution unique to probe, and the phase rotation caused by ununiformity in the magnetostatic intensity so as to allow high accuracy detection of the drive timing misalignment between the positive-side and the negative-side subcoils.

Advantageous Effects of Invention

The present invention is capable of detecting the timing misalignment by photographing of the projection image through execution of the pulse sequence and processing the projection image. This makes it possible to detect the timing misalignment with high accuracy without employing the additional measurement device.

BRIEF DESCRIPTION OF DRAWINGS

FIG. 8 is a view representing an echo measurement order according to the embodiment.

DESCRIPTION OF EMBODIMENT

«First Embodiment»
A first embodiment according to the present invention will be described. In all the drawings for explaining the embodiments of the present invention, the element with the same function will be designated with the same code, and repetitive explanation thereof will be omitted.

Figure 1:
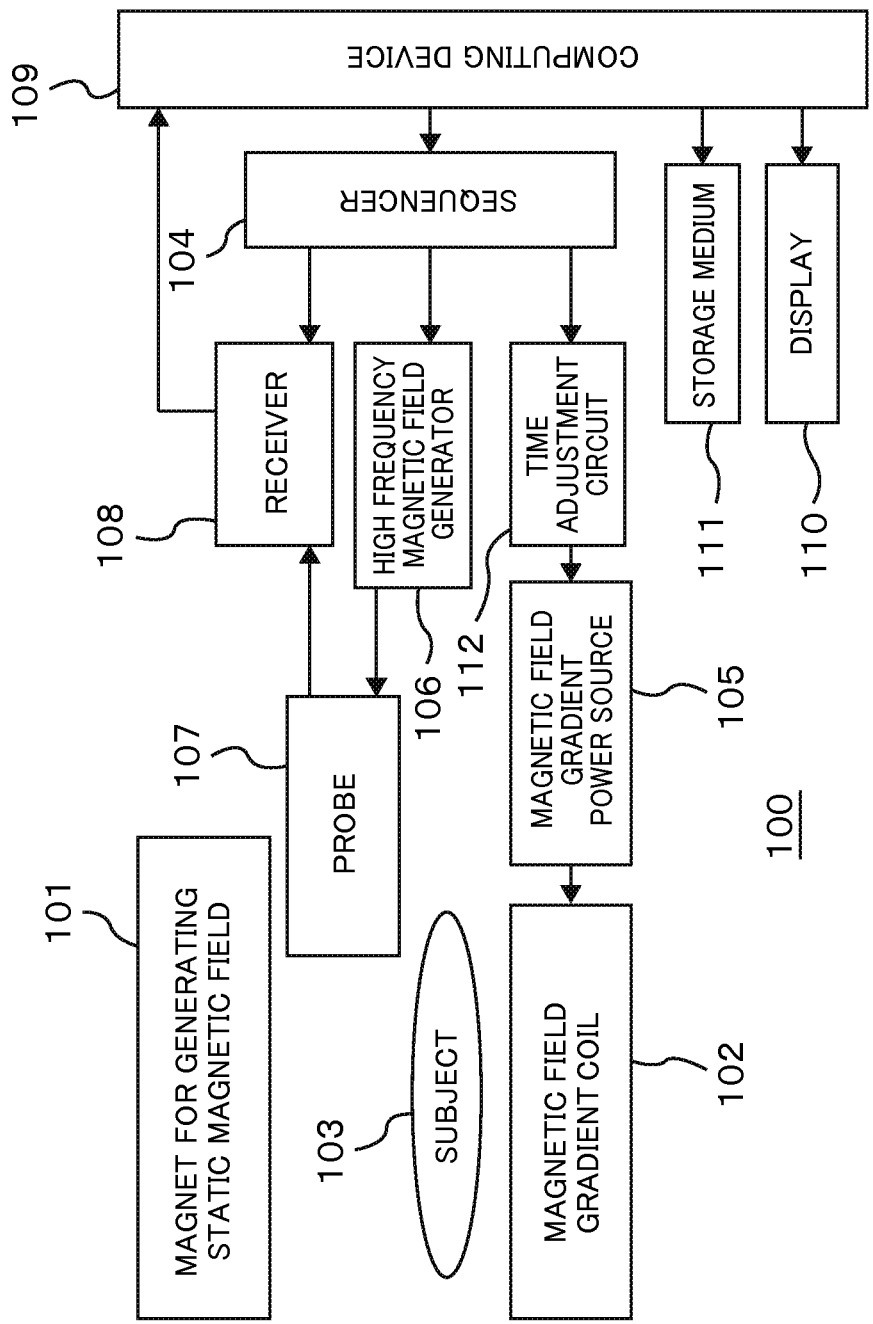
FIG. 1 is a block diagram schematically showing a structure of an MRI system according to an embodiment of the present invention.

The MRI system according to the embodiment will be described. FIG. 1 is a block diagram schematically showing a structure of an MRI system 100 according to the embodiment. The MRI system 100 includes a magnet 101 for generating the static magnetic field, a magnetic field gradient coil 102 for generating the magnetic field gradient, a sequencer 104, a magnetic field gradient power source 105, a high frequency magnetic field generator 106, a probe 107 for irradiating the high frequency magnetic field and detecting a nuclear magnetic resonance signal, a receiver 108, a computing device 109, a display 110, and a storage medium 111. A subject (for example, living body) 103 is laid on a bed (table) in the static magnetic field space generated by the magnet 101. The sequencer 104 sends a command to the magnetic field gradient power source 105 and the high frequency magnetic field generator 106 for generating the magnetic field gradient and the high frequency magnetic field, respectively. The high frequency magnetic field is applied to the subject 103 via the probe 107. The nuclear magnetic resonance signal generated by the subject 103 is received by the probe 107, and detected by the receiver 108. The nuclear magnetic resonance frequency (detection reference frequency f0), based on which the detection is performed is set by the sequencer 104. The detected signal is sent to the computing device 109 for signal processing such as image reconstitution. The result is displayed on the display 110. It is possible to store the detected signal and the measurement condition in the storage medium 111.

The MRI system 100 according to the embodiment is configured to input the command (magnetic field gradient pulse waveform) from the sequencer 104 to be described below to the magnetic field gradient power source 105 via a time adjustment circuit 112 for driving the magnetic field gradient coil 102. The magnetic field gradient coil includes coils wound in three directions along x-axis (102-1), y-axis (102-2) and z-axis (102-3) so that the magnetic field gradients Gx, Gy, Gz in the directions of the three axes are generated.

The magnetic field gradient coil of the respective axes includes two subcoil groups including the subcoils (102-11, 102-12, 102-21, 102-22, 102-31, 102-32) located at the positive side, and subcoils (102-13, 102-14, 102-23, 102-24, 102-33, 102-34) located at the negative side. An example of the magnetic field gradient coil is shown in FIGS. 3 and 4.

Figure 2:
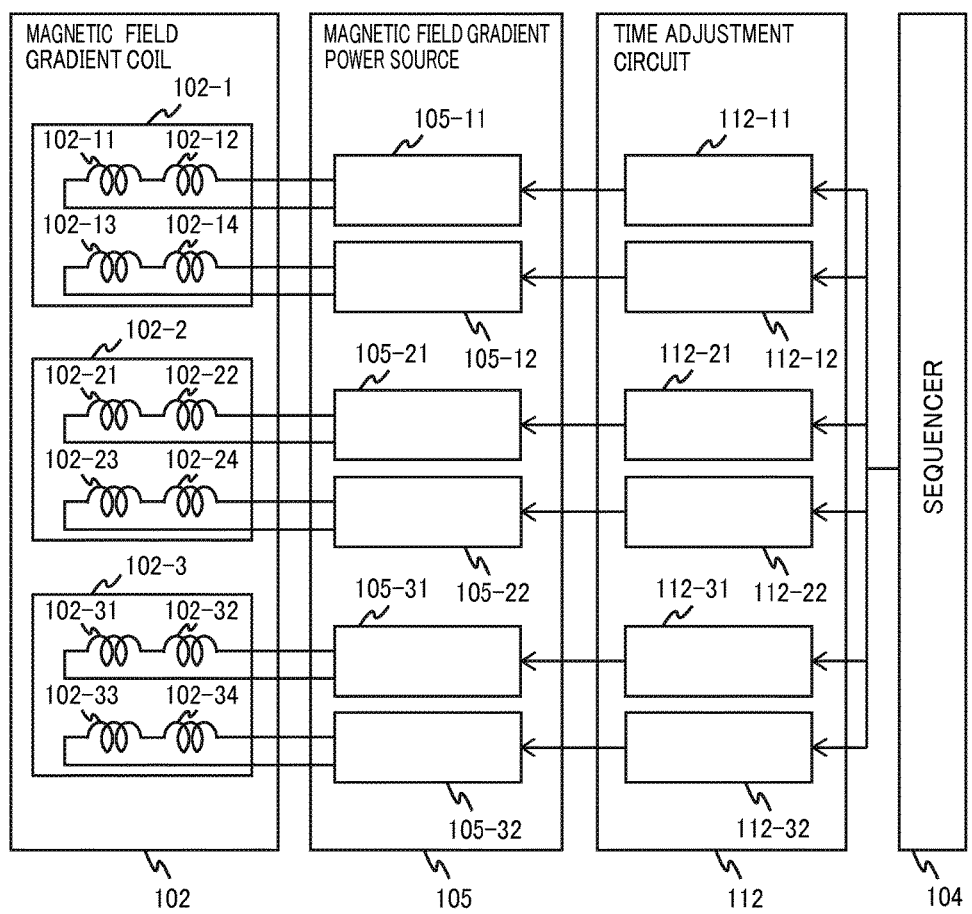
FIG. 2 is a block diagram showing structures of blocks 102, 105, 112 according to the embodiment in detail.
Figure 3:
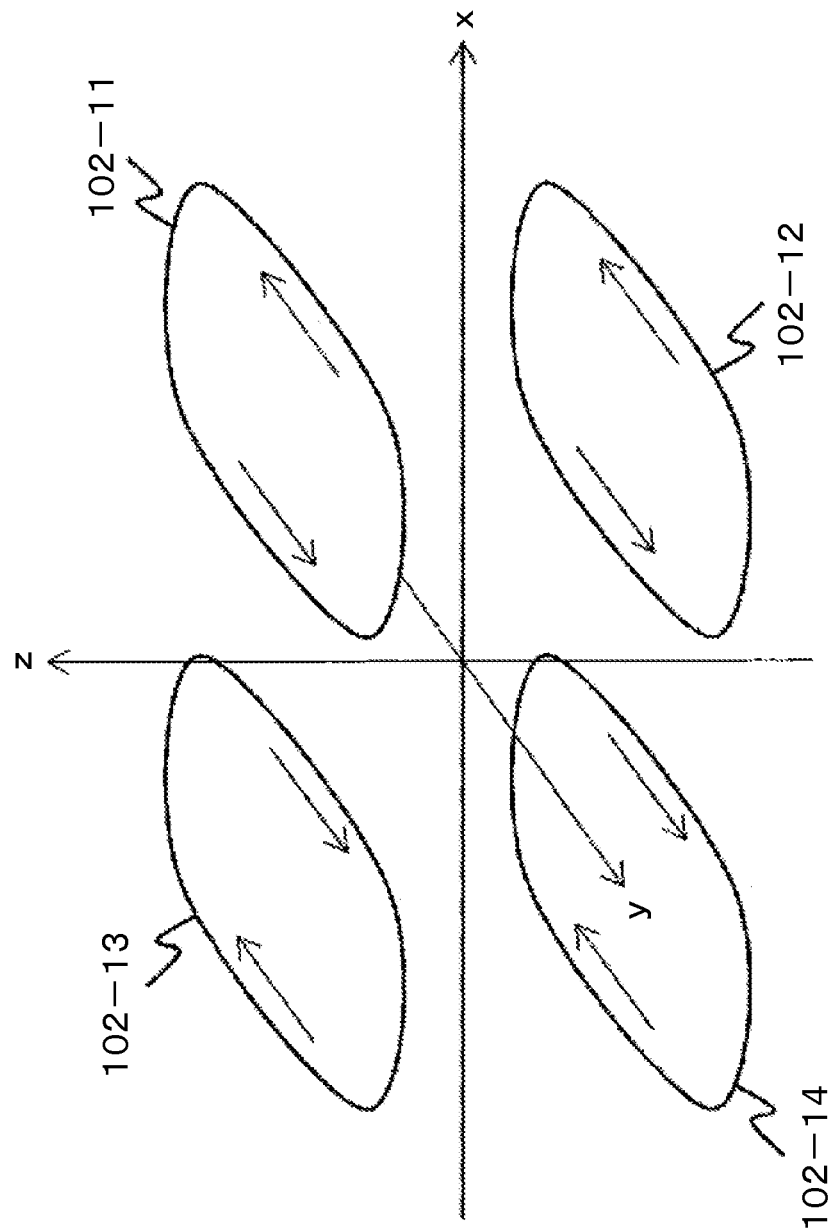
FIG. 3 is a perspective view showing a structure of a magnetic field gradient coil according to the embodiment.

FIG. 3 shows an example of the magnetic field gradient coil in the x-axis direction of the MRI system according to the embodiment. The MRI system according to the embodiment is of vertical magnetic field type, having the z-axis vertical to the horizontal surface corresponding to the static magnetic field direction. The subcoils 102-11 and 102-12 are disposed at the positive side of the x-axis, which are driven by the same power source 105-11 as FIG. 2 shows. If the magnetic field gradient has the positive polarity, the current direction is indicated by the arrow. Likewise, the subcoils 102-13, 102-14 are disposed at the negative side of the x-axis, which are driven by the same power source 105-12.

Figure 4:
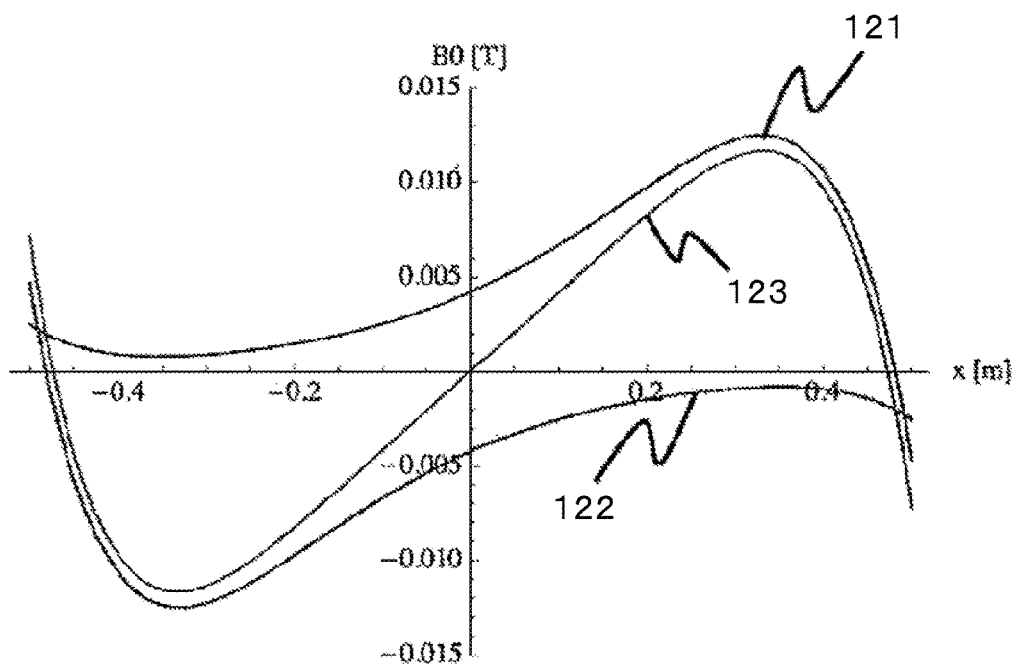
FIG. 4 is a view representing the magnetic field gradient intensity distribution of the magnetic field gradient coil according to the embodiment.

FIG. 4 shows distribution of the magnetic field gradient on the x-axis, which is generated by the magnetic field gradient coil in the x-axis direction as shown in FIG. 3. Referring to FIG. 4, the positive-side subcoils 102-11 and 102-12 generate the magnetic field directed to intensify the static magnetic field. The intensity distribution of the generated magnetic field is indicated by a line 121, representing the maximum intensity at the position positively biased to the x-direction from the origin (0,0,0) of the magnetic field gradient. The negative-side subcoils 102-13 and 102-14 generate the magnetic field directed to attenuate the static magnetic field, that is, the direction reverse to the static magnetic field. The intensity distribution of the resultant magnetic field is indicated by a line 122, representing the maximum intensity at the position negatively biased to the x-direction from the origin of the magnetic field gradient. When driving both the positive-side and the negative-side subcoils simultaneously by applying the current as indicated by arrows shown in FIG. 3, combined magnetic field of both subcoils is generated. A resultant magnetic field gradient distribution 123 is obtained, which changes the magnetic field intensity at a constant gradient along the x-axis.

Figure 5:
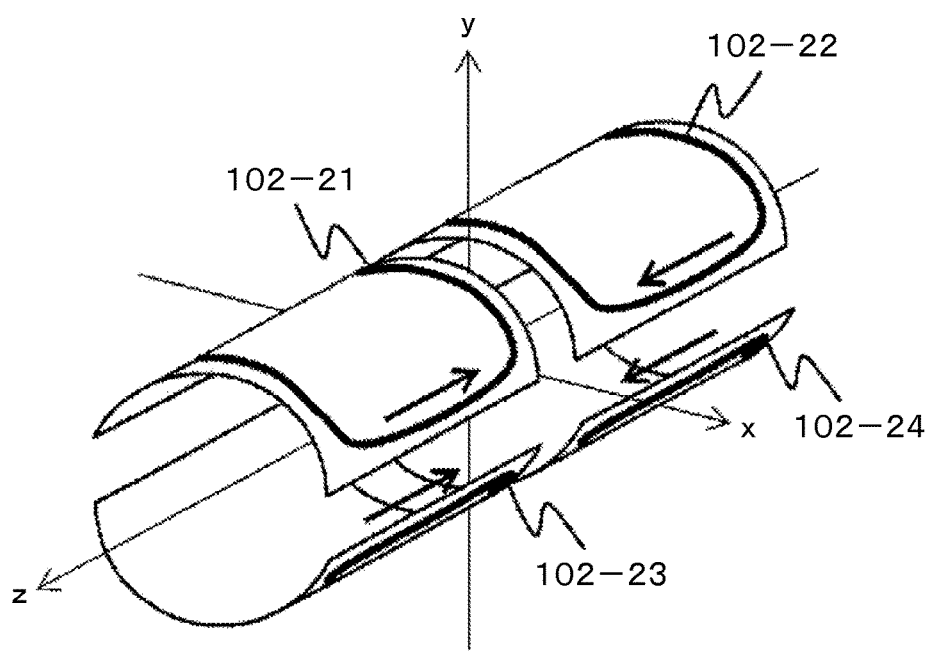
FIG. 5 is a perspective view showing another example of the magnetic field gradient coil.

The magnetic field gradient coil 102-2 in the y-axis direction and the magnetic field gradient coil 102-3 in the z-axis direction have different configurations, but have substantially the same mechanism as the magnetic field gradient coil in the x-axis direction as described above. The positive-side subcoil or subcoil group and the negative-side subcoil or subcoil group generate the magnetic fields directed to intensify and to attenuate the static magnetic field, that is, reversely from each other. The resultant magnetic field intensity distributions are different from each other. In the case where the positive-side subcoil or subcoil group and the negative-side subcoil or subcoil group are driven simultaneously, the magnetic field gradient with the gradient corresponding to the magnetic field intensity is generated along the desired axis. FIG. 5 shows an example of the magnetic field gradient coil in the y-axis direction of the MRI system of horizontal magnetic field type which is different from the one according to the embodiment. The z-axis is in the direction of the magnetostatic magnetic field is horizontal. The subcoils 102-21 and 102-22 are disposed at the positive side of the y-axis, and the subcoils 102-23 and 102-24 are disposed at the negative side of the y-axis. Those subcoils are driven by the current flowing in the direction indicated by arrows to generate the magnetic field gradient (magnetic field gradient in y-direction) imparting the gradient to the static magnetic field intensity along the y-axis.

Generally, the sequencer 104 executes the control so as to operate the respective components at the preliminarily programmed timing and intensity. The description of the program which especially relates to the high frequency magnetic field, the magnetic field gradient, the signal reception timing and intensity is referred to as the pulse sequence. The ON/OFF control signal in accordance with the pulse sequence for the magnetic field gradient will be transmitted toward three axes directions, and the magnetic field gradient power sources 105-11, 105-12, 105-21, 105-22, 105-31, 105-32 which are separately provided for the positive-side and the negative side subcoil groups, respectively. Time adjustment circuits 112-11, 112-12, 112-21, 112-22, 112-31, 112-32 are inserted into the path on which the control signal is transmitted from the sequencer 104 to the respective magnetic field gradient power sources. The above structure allows adjustment of the effective drive timing misalignment between the positive-side subcoil and the negative-side subcoil, which is generated by combining the magnetic field gradients in the respective axial directions.

The drive timing misalignment between the positive side and the negative side of the magnetic field gradient is caused by variance in the characteristic at various locations between the positive-side subcoil and the negative-side subcoil, respective power sources, respective signal paths, and the like. The drive timing misalignment between the positive side and the negative side causes deviation of the rise waveform and fall waveform of the magnetic field gradient from those designed. Especially, deviation of the rise waveform of the read-out magnetic field gradient pulse from the designed waveform may cause the shift in the echo appearance time. The aforementioned timing misalignment appears as the primary phase change with respect to the position where the slice image is projected in the case of the projection image derived from applying inverse-Fourier transformation on the echo measurement signal. Deviation of the rise waveform and the fall waveform from the designed waveform may cause unnecessary phase rotation in the magnetic field gradient pulse other than the read-out magnetic field gradient, thus causing the image deterioration. Therefore, it is necessary to accurately measure the drive timing misalignment between the positive-side subcoil and the negative-side subcoil, which is generated by combining the magnetic field gradients so that the misalignment is adjusted to zero. The MRI system 100 according to the embodiment is provided with the pulse sequence for detecting the drive timing misalignment between the positive-side subcoil and the negative-side subcoil for each axis.

The computing device 109 of the embodiment is provided with a projection image measurement unit serving to instruct the sequencer 104 to measure the nuclear magnetic resonance signal (echo) in accordance with the timing misalignment detection pulse sequence, and applying the inverse-Fourier transformation on the measured echo for generating the projection image, and a timing misalignment detection processing unit which detects the time misalignment based on the projection image. Those functions are realized by the CPU of the computing device 109 for loading the program stored in the storage medium 111 in the memory so as to be executed.

The pulse sequence executed in the MRI system 100 according to the embodiment for measurement of each timing misalignment of the respective axes in the magnetic field gradient will be described.

Figure 6:
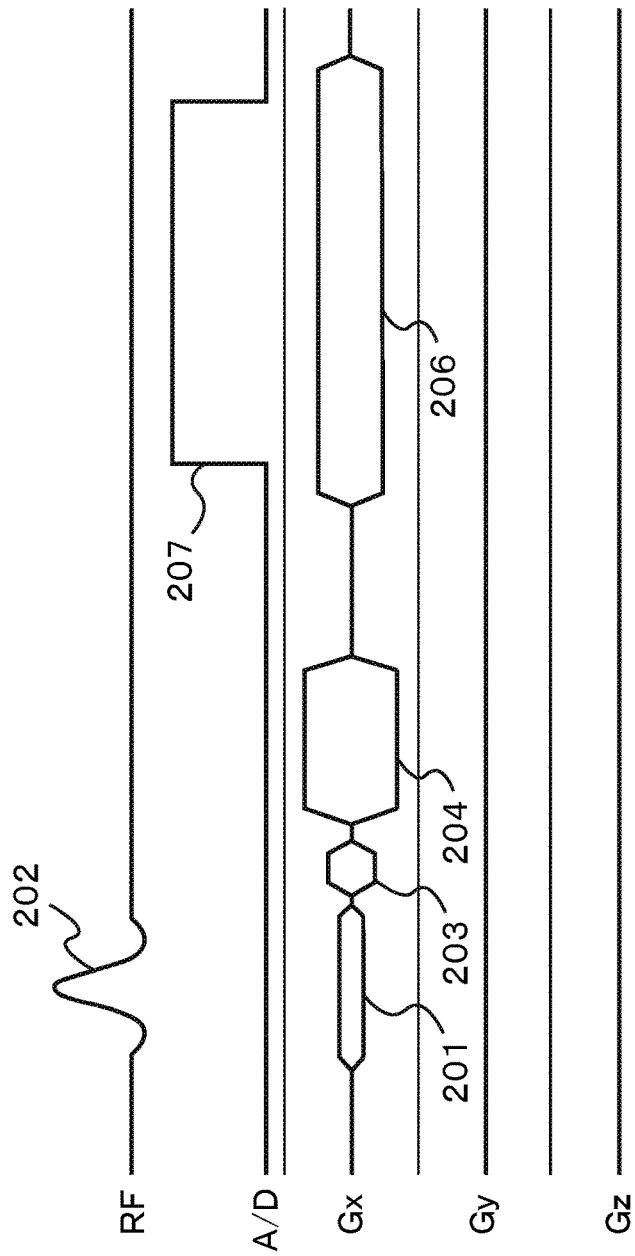
FIG. 6 is a view representing the pulse sequence for timing misalignment detection according to the embodiment.

FIG. 6 represents the pulse sequence for measuring the drive timing misalignment of the magnetic field gradient in the x-axis direction by using a gradient echo. Referring to the drawing, RF refers to a high frequency magnetic field waveform, Gx refers to a magnetic field gradient waveform of the axis (x-axis) subjected to measurement of the timing misalignment. The magnetic field gradients in the y-axis and z-axis directions are not generated as Gy and Gz show. According to the pulse sequence, a slice magnetic field gradient pulse 201 in the axial direction to be measured (x-direction) is applied, and a high frequency magnetic field (RF) pulse 202 having a proton resonance frequency fh is irradiated for exciting the proton of the predetermined slice in the subject. A slice rephase magnetic field gradient pulse 203 and a dephasing read-out magnetic field gradient 204 for adding the location information of the read-out direction (x-direction) are applied. Thereafter, A/D conversion (for the period 207) is performed while applying a read-out magnetic field gradient pulse 206 to measure the magnetic resonance signal. In this way, the pulse sequence is characterized in that, likewise the slice magnetic field gradient pulse, the read-out magnetic field gradient pulse employs the magnetic field gradient in the direction of the axis to be measured (x-axis).

Figure 7:
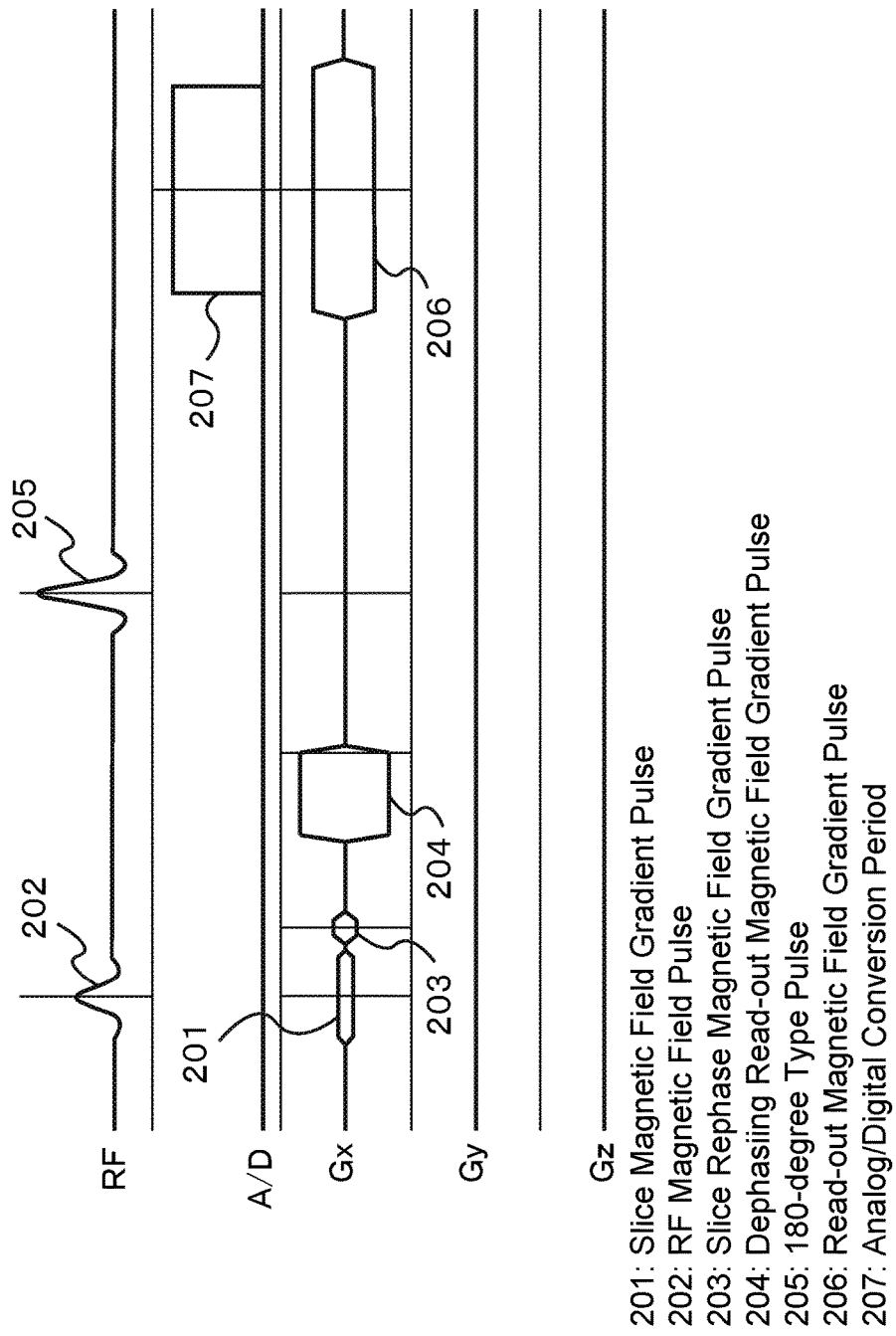
FIG. 7 is a view representing another example of the pulse sequence for timing misalignment detection.

The sequence for generating and measuring the spin echo may be employed as the pulse sequence for timing misalignment detection. FIG. 7 shows an example of the pulse sequence for measuring the drive timing misalignment of the x-axis magnetic field gradient likewise the one shown in FIG. 6. According to the pulse sequence, the slice magnetic field gradient pulse 201 in the x-direction is applied, and the high frequency magnetic field (RF) pulse 202 having proton resonance frequency fh is irradiated for exciting the proton of the predetermined slice in the subject. The slice rephase magnetic field gradient pulse 203 and the dephasing read-out magnetic field gradient 204 for adding the location information in the read-out direction (x-direction) are applied. Thereafter, a 180-degree type pulse 205 is irradiated. Then A/D conversion (for the period 207) is performed while applying the read-out magnetic field gradient pulse 206 to measure the single echo.

The projection image measurement unit measures four echoes by repeatedly executing the pulse sequence shown in FIG. 6 or 7 four times. The inverse-Fourier transformation is applied to the respective echoes to generate four projection images. Upon measurement of four echoes, the slice magnetic field gradient, the excitation frequency, and the read-out magnetic field gradient are changed as shown in FIG. 8. In other words, the echo No. 1 is measured in the condition where the polarity of the slice magnetic field gradient 201 in the x-direction is negative, and the frequency of the excitation RF pulse 202 is negatively shifted with respect to the proton resonance frequency of the static magnetic field. The location of the slice to be excited is positively shifted in the x-direction by x1 from the origin of the magnetic field gradient. The read-out magnetic field gradient 206 has the positive polarity. This applies to the sequence having the waveform of the magnetic field gradient Gx indicated by the thin line in the sequence as shown in either FIG. 6 or 7.

The echo No. 2 is measured in the condition where the polarity of the slice magnetic field gradient pulse 201 is positive, and the frequency of the excitation RF pulse 202 is negatively shifted. The location of the slice to be excited is negatively shifted in the x-direction by x1 from the origin of the magnetic field gradient. The read-out magnetic field gradient 206 becomes negative. This applies to the sequence having the waveform of the magnetic field gradient Gx indicated by the bold line as shown in FIG. 6 or 7. The echo No. 3 is measured in the condition where the polarity of the slice magnetic field gradient pulse 201 is positive, and the frequency of the excitation RF pulse 202 is positively shifted. The slice position is then positively shifted in the x-direction (+x1), and the polarity of the read-out magnetic field gradient 206 is negative. The echo No. 4 is measured in the condition where the polarity of the slice magnetic field gradient pulse 201 is negative, and the frequency of the excitation RF pulse 202 is positively shifted. The slice position is negatively shifted in the x-direction (−x1), and the read-out magnetic field gradient 206 is positive. In this way, the polarity of the slice magnetic field gradient and the excitation frequency are changed to perform the measurement twice for excitation of the slice on the x-axis at the positive position +x1, and the measurement twice for excitation of the slice on the x-axis at the negative position −x1. The measurement may be conducted in an arbitrary order. In the case where the excitation is repeatedly executed at the same position, the standby time is required until magnetization is brought into the equilibrium state. On the contrary, the measurement is executed in the order as shown in FIG. 8 for excitation at the positive and the negative positions alternately so as to reduce the standby time by half. This makes it possible to reduce the measurement time. Other main photographing parameters include the field of vision set to 400 mm, the slice position set to +/−100 mm, the slice thickness set to 20 mm, TR/TE set to 1000/10 ms, and the number of sampling points set to 512.

The following is the description with respect to the procedure for detecting the drive timing misalignment of the magnetic field gradient using four projection images which have been photographed by executing the timing misalignment detection pulse sequence.

Figure 9:
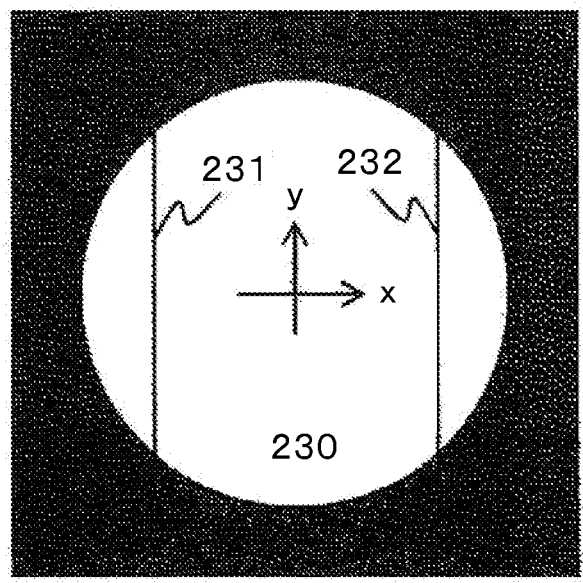
FIG. 9 is a view representing an example of a subject to be photographed according to the embodiment.

A water phantom 230 having a spherical shape with diameter of 300 mm is used as the subject to be photographed, and disposed at the location near the origin of the magnetic field gradient. FIG. 9 illustrates a cross section image of the water phantom in the condition of z=0. The timing misalignment detection process according to the embodiment uses the phase of the projection image for detection of the drive timing misalignment between the positive-side and the negative-side subcoils for generating the magnetic field gradient as described later. For that reason, there is no problem if the signal intensity at the positive side is different from the one at the negative side. Accordingly, installation accuracy of the subject to be photographed is not an important factor. The positions of the slice +/−x1 to be excited by the timing misalignment detection pulse sequence are set to +/−100 mm, indicated by 231, 232 in FIG. 9. The subject to be photographed is not limited to the one with uniform proton distribution like the water phantom. The shape does not have to be spherical so long as sufficient proton exists in the range between the selected positive and negative slice positions.

Four echoes from echo Nos. 1 to 4 of the subject to be photographed are measured using the pulse sequence for timing misalignment detection. The inverse-Fourier transportation is applied on the respective echoes to generate the projection images in the x-direction. FIG. 8 shows the echo measurement order.

The drive timing misalignment between the positive and the negative sides of the magnetic field gradient may deform the magnetic field gradient pulse waveform at the timing of rise and fall, resulting in shifting of echo with time. The resultant influence appears as the primary phase change with respect to the coordinate position to which the projection image of the echo is projected. Referring to the pulse sequence for detecting the drive timing misalignment of the magnetic field gradient in the x-direction according to the embodiment as shown in FIG. 6 or 7, the drive timing misalignment between the positive and the negative sides in the case of both the slice magnetic field gradient pulse 202 and the read-out magnetic field gradient 206 gives an influence on the projection image phase of the echo. The phase change $\theta_{S+,-}$ of the projection image caused by the drive timing misalignment of the slice magnetic field gradient pulse, and the phase change $\theta_{R+,-}$ of the projection image caused by the drive timing misalignment of the read-out magnetic field gradient pulse will be expressed by the following formula (1).

$$\theta_{R+,-} = \frac{\Delta t_{GC+,-}}{\Delta T_{AD}} \frac{2\pi}{Fov} \propto \Delta t_{GC+,-} : \qquad [\text{Formula 1}]$$

Phase rotation by Gr delay
$\theta_{S+,-} = Gs \cdot \Delta t_{GC+,-}$: Phase rotation by Gs delay
$\Delta t_{AD}$: Misalignment during A/D period
$\Delta T_{AD}, F_{OV}$: Sampling interval, Field of vision
Gs: Slice magnetic field gradient intensity Both $\theta_{S+,-}$ and $\theta_{R+,-}$ are proportional to the effective drive timing misalignment $\Delta_{GC+,-}$ which occurs between the positive-side and the negative-side subcoils in the process of combining the magnetic field gradients in the x-direction.

The phase rotation caused by the time misalignment is reversed by inverting the polarity of the magnetic field gradient pulse. At the positive and the negative sides at equal intervals (+/−x1) from the origin, the ratio of the intensity to the magnetic field between the positive-side subcoil and the negative-side subcoil is inverted. The aforementioned inversion is used in the following time misalignment detection process to clarify the relationship between the phase and the time misalignment while eliminating the factor other than the drive timing misalignment between the positive-side subcoil and the negative-side subcoil, for example, ununiformity in the static magnetic field and the phase distribution of the reception coil.

Phases of the four projection images measured in accordance with the time misalignment detection pulse sequence will be expressed by the following formula (2).

[Formula 2]

$$\begin{aligned}
\text{echo 1:} \quad & \theta_{+x_1+Gr}(x) = \theta_{RF} + \Delta B_0 + (\theta_{AD} + \theta_+ + \alpha \cdot \theta_-)x + c_1 \\
\text{echo 2:} \quad & \theta_{-x_1-Gr}(x) = \theta_{RF} + \Delta B_0 - (\theta_{AD} + \theta_- + \alpha \cdot \theta_+)x + c_2 \\
\text{echo 3:} \quad & \theta_{+x_1-Gr}(x) = \theta_{RF} + \Delta B_0 - (\theta_{AD} + \theta_+ + \alpha \cdot \theta_-)x + c_3 \\
\text{echo 4:} \quad & \theta_{-x_1-Gr}(x) = \theta_{RF} + \Delta B_0 + (\theta_{AD} + \theta_- + \alpha \cdot \theta_+)x + c_4
\end{aligned} \quad (2)$$

$\theta_{RF} = \theta_{RF}(x)$: Phase rotation caused by phase distribution unique to probe $\Delta B_0 = \Delta B_0(x)$: Phase rotation caused by ununiformity in static magnetic field $$\theta_{AD} = \frac{\Delta t_{AD}}{\Delta T_{AD}} \frac{2\pi}{Fov}:$$

Phase rotation caused by misalignment during A/D period $$\left. \begin{aligned} \theta_+ &= \theta_{R+} + \theta_{S+} \\ \theta_- &= \theta_{R-} + \theta_{S-} \end{aligned} \right\}:$$

Phase rotation caused by delay $\alpha(\ll 1)$: Intensity ratio of magnetic field between positive-side and negative-side subcoils in the condition of $x = +/- x1$ $C_{1, 2} \ldots$: Phase offset The left side, for example, $\theta_{+x1+Gr}(x)$ denotes the phase of the projection image at the position x measured in the positive read-out magnetic field gradient through excitation at the slice position +x1. Each phase of the projection images is derived either from sum or difference of the phase distribution $\theta_{RF}(x)$ unique to probe, the phase distribution $\Delta B(x)$ caused by ununiformity in the static magnetic field, the phase rotation $\theta_{AD}$ caused by misalignment during the A/D period, the phase rotations $\theta_+$ and $\theta_-$ caused by the drive timing misalignment (delay) between the positive-side and the negative-side subcoils of the magnetic field gradient, and a phase offset c independent of the position. If the slice position is at the positive side, the intensity of the magnetic field generated by the positive-side subcoil is higher than that of the magnetic field generated by the negative-side subcoil. Therefore, the influence of the negative-side subcoil on the timing misalignment is small. The phase rotation caused by the negative-side timing misalignment is multiplied by the coefficient α smaller than 1.

Firstly, the difference in the projection image between the echo Nos. 1 and 3, and the difference in the projection image between the echo Nos. 4 and 2 are obtained using the following formula (3) so as to eliminate the phase distribution caused by the phase distribution unique to probe and ununiformity in the static magnetic field, which are contained in the respective projection images.

[Formula 3]

$$\left. \begin{aligned} \theta_{+x_1}(x) &= \theta_{+x_1+Gr}(x) - \theta_{+x_1-Gr}(x) = 2(\theta_{AD} + \theta_+ + \alpha \cdot \theta_-)x + c_1 - c_3 \\ \theta_{-x_1}(x) &= \theta_{-x_1+Gr}(x) - \theta_{-x_1-Gr}(x) = 2(\theta_{AD} + \theta_- + \alpha \cdot \theta_+)x + c_4 - c_2 \end{aligned} \right\} \quad (3)$$

In this case, $\theta_{+x1}(x)$ denotes the phase of the difference in the projection image between the echo Nos. 1 and 3, reflecting the spin of the slice at the positive side (+x1), and $\theta_{-x1}(x)$ denotes the phase of the difference in the projection image between the echo Nos. 4 and 2, respectively, reflecting the spin of the slice at the negative side (−x1). As the right side of the formula (3) indicates, according to the two differences, the phase distribution unique to probe and the phase distribution caused by ununiformity in the static magnetic field are cancelled. Then phase difference between the two differences expressed in the formula (3) is obtained for the purpose of eliminating the phase rotation caused by the misalignment during the A/D period. Because of difference in the excitation at the position between those two differences, the slice position −x1 of the difference between the projection images of the negative-side slice as expressed by the second formula in the formula (3) is shifted in parallel by +2x1 as shown by the formula (4) to be in alignment with the slice position +x1 of the first difference as expressed in the formula (3).

[Formula 4]

$$\left. \begin{aligned} \theta_{+x_1}(x) &= 2(\theta_{AD} + \theta_+ + \alpha \cdot \theta_-)x + c_1 - c_3 \\ \theta_{-x_1}(x - 2x_1) &= 2(\theta_{AD} + \theta_- + \alpha \cdot \theta_+)x + c_5 \end{aligned} \right\} \quad (4)$$

The phase difference is obtained as expressed by the formula (5).

[Formula 5]

$$\theta_{+x_1}(x) - \theta_{-x_1}(x - 2x_1) = 2(\theta_+ - \theta_-)(1-\alpha)x + c_6 \propto (\Delta t_{GC+} - \Delta t_{GC-})x \quad (5)$$

Referring to the formula (5), the resultant phase difference changes with respect to the location x according to a linear function. The slope is proportional to the difference between the delay time (delay) of the positive-side subcoil and the delay time (delay) of the negative-side subcoil ($\Delta t_{GC+} - \Delta t_{GC-}$). The slope of the phase difference is obtained while changing the delay time at one side, and the width for changing the delay time that makes the phase difference slope zero is further obtained so as to provide the drive timing misalignment between the positive and the negative sides.

Figure 10:
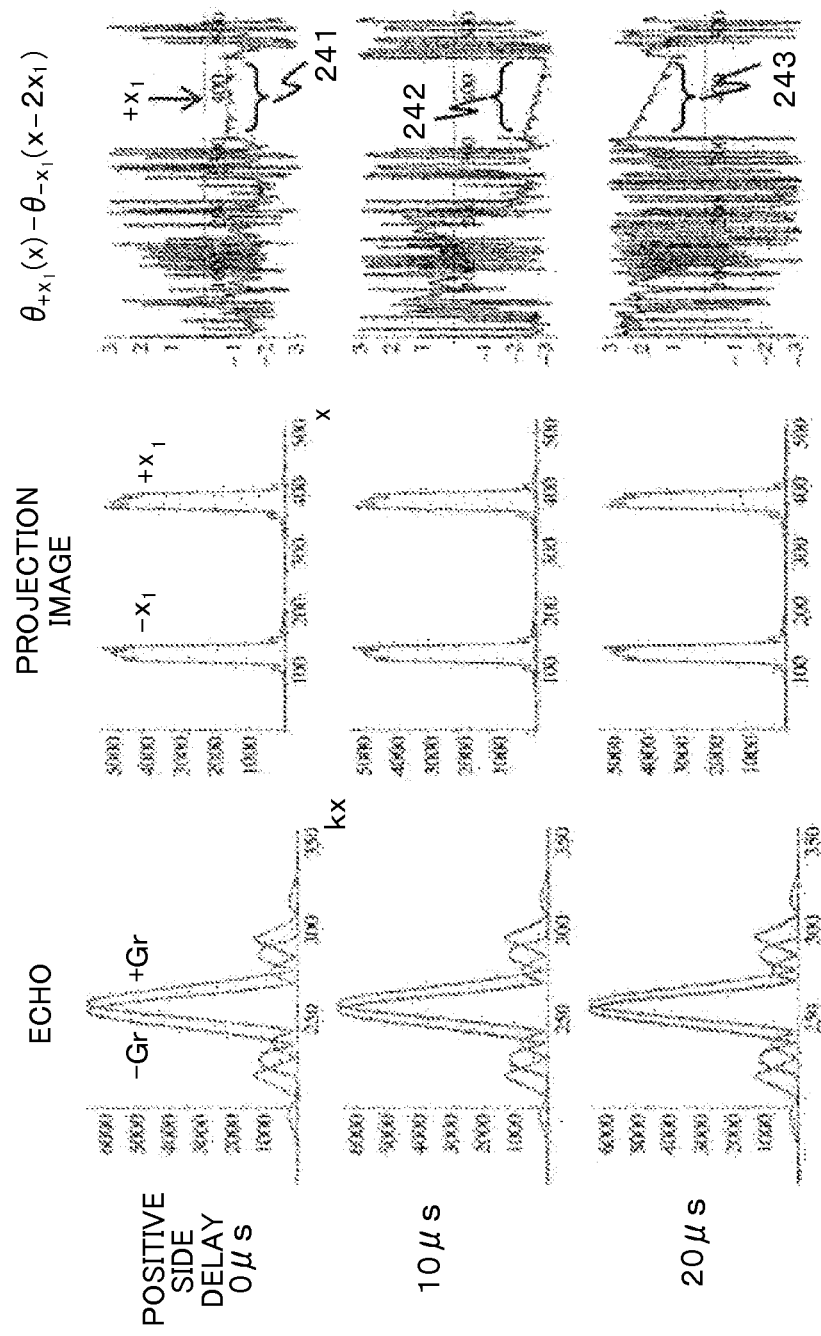
FIG. 10 is view representing the projection image and the phase difference in the course of the process according to the embodiment.
Figure 11:
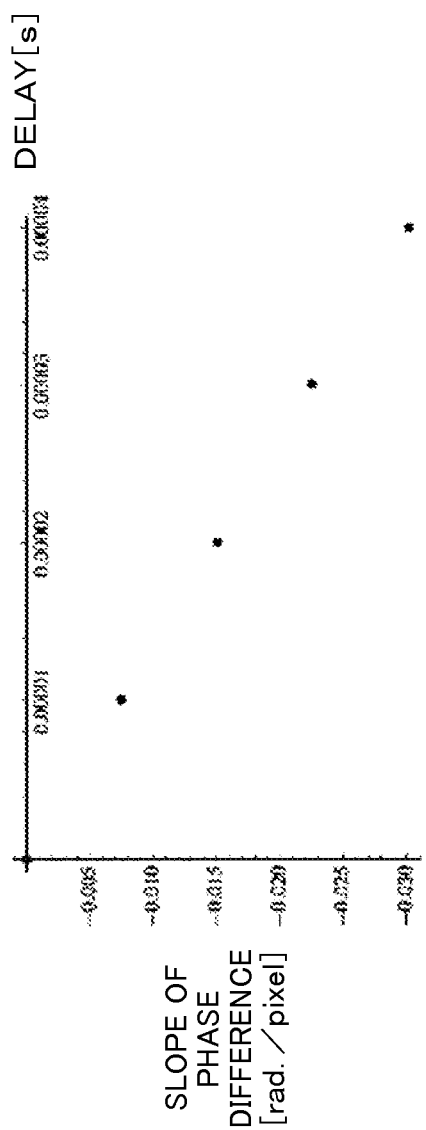
FIG. 11 is a view representing the relationship between the slope of the phase difference between the projection images derived from the pulse sequence and the drive timing delay of one subcoil group.

FIGS. 10 and 11 show results of repetitive processing executed as described above while changing the delay time (delay). FIG. 10 represents echoes, projection images, and the phase differences (results of the formula (5)) by setting the positive-side delay to 0 μs, 10 μs and 20 μs, respectively. Four echoes and four projection images are superposably displayed, respectively. As the echoes at the same slice positions are overlapped, and the projection images each having polarity of the read-out magnetic field gradient inverted are overlapped. Therefore, it appears that only two echoes or two projection images are displayed. It is shown that the slope from the phase difference 241 to 243 around the +x1 becomes larger as the positive-side delay time is increased. FIG. 11 is the graph formed by plotting the slopes with respect to the delay. FIG. 11 shows that the slope of the phase difference is proportional to the delay.

Figure 12:
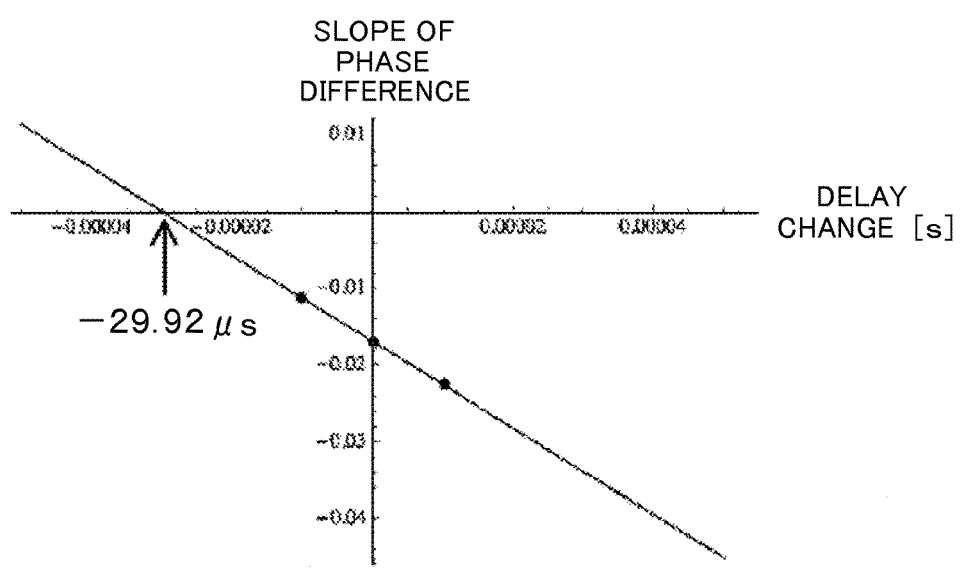
FIG. 12 is an explanatory view with respect to measurement of the subcoil drive timing misalignment according to the embodiment.

FIG. 12 shows an example of the actually estimated delay. FIG. 12 shows results of the slope of the phase difference measured three times by changing the positive-side delay by +/−10 μs. The slope of the phase difference changes in proportion to the delay change. As a result of linear function fitting of those three points, −29.92 μs is obtained as the intersection value with respect to the x-axis that makes the slope of the phase difference zero. In other words, if the positive-side delay is shifted by −29.92 μs, the delay difference between the positive side and the negative side may be eliminated.

The thus obtained time misalignment correction value −29.92 μs is set in the time adjustment circuit 112-11. This may adjust the time for the magnetic field gradient pulse waveform generated from the sequencer 104 so that the magnetic field gradient is generated at the same timing both at the positive and the negative sides.

The embodiment has been described, taking the x-axis as the example. The time misalignment may also be measured and determined with respect to both the y-axis and the z-axis.

Figure 13:
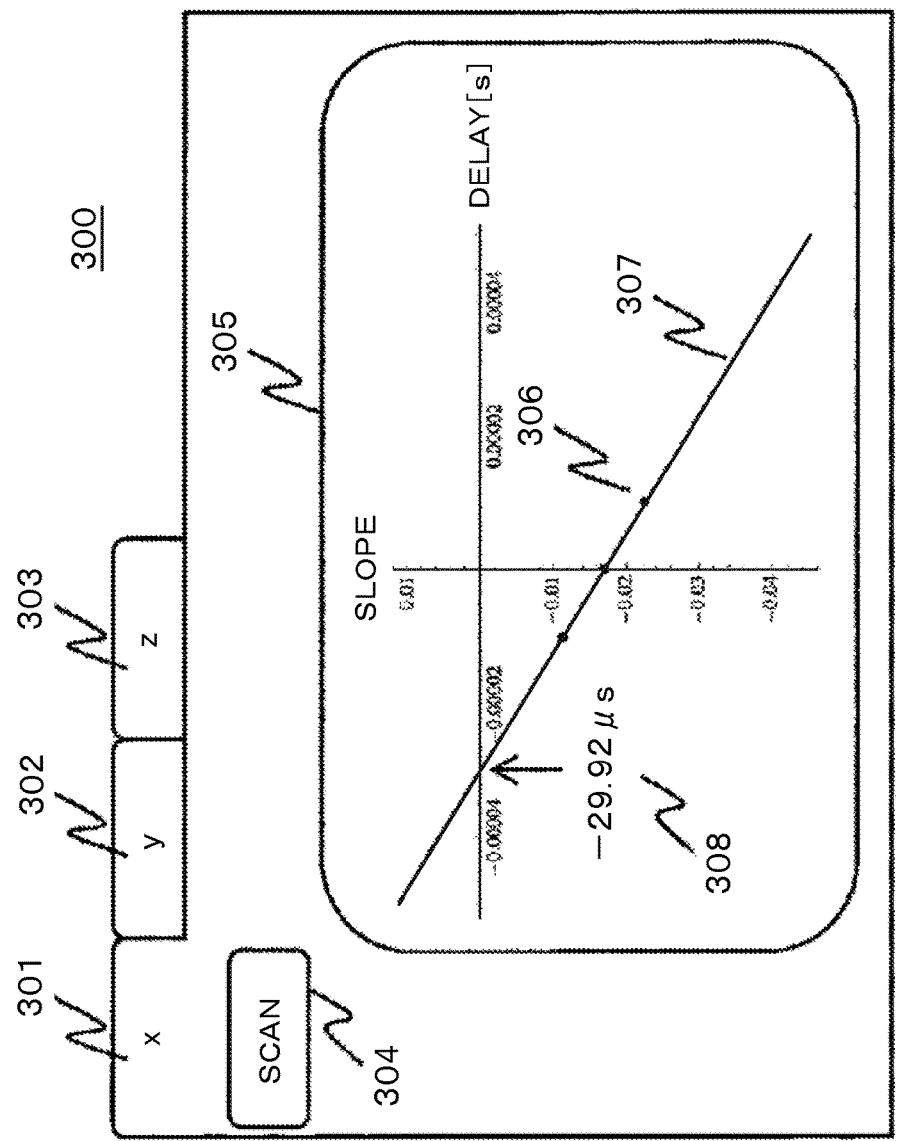
FIG. 13 is an explanatory view of an operation screen for adjusting the subcoil drive timing misalignment according to the embodiment.

FIG. 13 shows an example of an operation screen 300 for executing the time misalignment adjustment of the magnetic field gradient on the system as described above. Each operation screen of those 3 axes of x, y and z has the similar structure. The axis may be switched by selecting the tab from 301 to 303. The operation screen for each axis displays an adjustment start button 304, and an adjustment result field 305. Upon pressing of the adjustment start button, the phase difference slope is measured with respect to the predetermined delay change value in accordance with the aforementioned method, and is subjected to the linear function fitting so as to obtain the adjustment value. The results are displayed on the adjustment result field 305. The adjustment result field displays a measurement point 306 of the phase difference slope, a linear function fitting result 307, and an adjustment value 308. The adjustment value is automatically set in the time adjustment circuit.

As the number of times for measuring the phase difference slope becomes large, noise will be substantially uninfluential, improving accuracy of the linear function fitting. As a result, accuracy of the delay to be obtained is also improved. However, as the time required for the measurement is prolonged, the measurement performed 5 to 10 times may be sufficient.

According to the embodiment as described above, the phase difference slope is measured a plurality of times while changing the delay. It is possible to obtain the time misalignment from the single value of the phase difference slope. For example, use of α provided when the magnetic field gradient coil has been designed allows the direct computation of the time misalignment from the formula (6) derived from modification of the formula (5).

[Formula 6]

$$\theta_{+x_1}(x) - \theta_{-x_1}(x - 2x_1) = \qquad (6)$$
$$2\left(Gs + \frac{2\pi}{\Delta T_{AD} \cdot Fov}\right)(\Delta t_{GC+} - \Delta t_{GC-})(1 - \alpha)x + c_6$$

Assuming that the slope in the formula (6) is set to a, the difference in the time misalignment $\Delta t_{GC+} - \Delta t_{GC-}$ may be obtained by using a, the slice magnetic field gradient intensity, the sampling rate, the field of vision, and α.

[Formula 7]

$$a = 2\left(Gs + \frac{2\pi}{\Delta T_{AD} \cdot Fov}\right)(\Delta t_{GC+} - \Delta t_{GC-})(1 - \alpha) \qquad (7)$$

$$\Delta t_{GC+} - \Delta t_{GC-} = \frac{a}{2\left(Gs + \frac{2\pi}{\Delta T_{AD} \cdot Fov}\right)(1 - \alpha)}$$

The contribution of the subcoil at the opposite side to the magnetic field is lessened as it moves away from the origin. Therefore, the slice position is kept apart from the origin as far as possible so long as the magnetic field gradient is within the linear region (in an example shown in FIG. 4, up to +/−300 mm approximately) so that the detection accuracy of the time misalignment becomes higher.

In the aforementioned example, the value set to +/−100 mm allows sufficient accuracy.

Each thickness of the slice gives an influence on the detection accuracy of the time misalignment. The contribution of the subcoil at the opposite side to the magnetic field becomes large as it is closer to the origin. If the slice thickness is increased to be close to the origin, each contribution of the positive-side and the negative side subcoils to the magnetic field is variable depending on the location. For that reason, the increase in the slice thickness may lessen the detection accuracy of the time misalignment. If the slice thickness is decreased, the signal-to-noise ratio (SN ratio) is reduced, thus lessening the detection accuracy of the time misalignment. In this embodiment, the thickness is set to 20 mm which allows sufficient SN ratio. However, if the SN ratio is insufficient, the thickness may be increased up to approximately 40 mm.

As described above, the embodiment is configured to detect the drive timing misalignment upon driving of the magnetic field gradient subcoils both at the positive and the negative sides in parallel by different power sources based on the difference in changes in phases of the positive-side and the negative-side projection image. This makes it possible to eliminate the influence of the misalignment during the A/D period so as to allow accurate detection of the drive timing misalignment. Use of the phase difference of the projection image measured by inverting the sign of the magnetic field gradient pulse eliminates the influence of the probe phase distribution and ununiformity in the static magnetic field so as to accurately detect the drive timing misalignment. Photographing of the projection image through execution of the pulse sequence and processing of the projection image allow detection of the drive timing misalignment. It is therefore unnecessary to employ an additional measurement device.

«Modified Example of Embodiment»

In the first embodiment, the echo is measured by executing four kinds of timing misalignment detection pulse sequences so as to sequentially cancel the phase distribution unique to probe mixed with each phase of the respective projection images, the phase distribution caused by ununiformity in the static magnetic field, and the phase rotation caused by misalignment of the reception signal during the A/D period. In the case where such factors as the phase distribution unique to probe and ununiformity in the static magnetic field are small, which are substantially uninfluential to detection of the drive timing misalignment of the magnetic field gradient subsoil, it is possible to use easier measurement process which omits the aforementioned cancelling process.

One of the aforementioned modified examples employs only the pulse sequences for measuring the echo Nos. 1 and 4 among four kinds of the pulse sequences for the echo Nos. 1 to 4 shown in FIG. 8. Specifically, the pulse sequence is executed in the condition where the slice magnetic field gradient has the negative polarity, and the excitation frequency is negatively shifted from the Larmor frequency in the static magnetic field intensity to measure the echo No. 1 that reflects the spin in the slice at the positive-side location +x1 in the magnetic field gradient. The pulse sequence is executed in the condition where the slice magnetic field gradient has the negative polarity, and the excitation frequency is positively shifted from the Larmor frequency to measure the echo No. 4 that reflects the spin in the slice at the negative-side location −x1 in the magnetic field gradient. The pulse sequence used for time misalignment detection may be the one for generating the gradient echo as shown in FIG. 6 so as to be measured, or the one for generating the spin echo as shown in FIG. 7 so as to be measured.

The phase of the projection image derived from applying the inverse-Fourier transformation on the respective measurement signals will be expressed by $\theta_{+x1+Gr}(x)$, $\theta_{-x1+Gr}(x)$ in the formula (2). As each slice position of both the projection images is shifted by 2·x1, the slice position is aligned by shifting the projection image of the echo No. 4 by 2·x1 in the x-axis direction. The phases of the two shifted projection images are expressed by the formula (8).

[Formula 8]

$$\theta_{+x_1+Gr}(x) = \theta_{RF} + \Delta B_0 + (\theta_{AD} + \theta_+ + \alpha \cdot \theta_-)x + c_1 \\ \theta_{-x_1+Gr}(x - 2x_1) = \theta_{RF} + \Delta B_0 + (\theta_{AD} + \theta_- + \alpha \cdot \theta_+)x + c_7 \quad (8)$$

The slice positions of both the projection images before shifting are different. Accordingly, the value of the phase rotation $\theta_{RF}$ unique to probe, and the value $\Delta B_0$ of phase rotation caused by ununiformity of the static magnetic field in the first formula of (8) do not coincide with the value $\theta_{RF}$ of the phase rotation unique to probe, and the value $\Delta B_0$ of the phase rotation caused by uniformity of the static magnetic field in the second formula of (8). However, if those values are sufficiently small so that the detection is hardly influenced, it may be considered that the phase rotations are cancelled by the process of the difference between the projection images. The phase difference computed through the difference process is expressed by the formula (9).

[Formula 9]

$$\theta_{+x_1+Gr}(x) - \theta_{-x_1+Gr}(x - 2x_1) = (\theta_+ - \theta_-)(1-\alpha)x + c_8 \alpha \\ (\Delta t_{GC+} - \Delta t_{GC-})x \quad (9)$$

It is clarified that the difference process after shifting the projection image of the echo No. 4 in the x-axis direction by 2·x1 serves to cancel the phase rotation $\theta_{AD}$ caused by the timing misalignment during the A/D conversion of the signal mixed with the phases of two projection images, and the slope of the phase difference resulting from the difference with respect to the x-axis corresponds to the drive timing misalignment between the positive-side and the negative-side magnetic field gradient subcoils. Likewise the first embodiment as described above, the measurement is repeatedly performed a plurality of times while changing the delay time of one of the positive-side and the negative-side subcoils by a predetermined time width. The respective results of the measurement performed a plurality of times are used to obtain each slope of the phase difference between the projection images of the echo No. 1 before and after shifting, and the phase difference between the projection images of the echo No. 4 before and after shifting with respect to the location. The obtained slope value is used to calculate the delay time misalignment corresponding to the slope of the phase difference equivalent to zero. In other words, the drive timing misalignment between the positive-side and the negative-side subcoils before adjustment is computed.

The measurement method as described above employs pulse sequences only for measuring the echo Nos. 1 and 4 among those four kinds of the echo Nos. 1 to 4 shown in FIG. 8. There may be another modified example which employs the pulse sequences only for measuring the echo Nos. 1 and 2 so as to compute the drive timing misalignment between the positive-side and the negative-side subcoils. Specifically, the pulse sequence is executed in the condition where the slice magnetic field gradient has negative polarity, and the exciting frequency is negatively shifted from the Larmor frequency in the static magnetic field intensity to measure the echo No. 1 that reflects the spin in the slice at the positive-side location +x1 in the magnetic field gradient. The echo No. 2 that reflects the spin in the slice at the negative location −x1 in the magnetic field gradient is measured by executing the pulse sequence only having the polarity of the slice magnetic field gradient inverted to positive. In this case, the applied pulse sequence for detection may be the one as shown in FIG. 6 or in FIG. 7. Among the projection images derived from applying the inverse-Fourier transformation on the respective measurement signals, the projection image of the echo No. 2 is shifted by 2·x1 in the x-axis direction for alignment of the slice position. The phases $\theta_{+x1+Gr}(x)$ and $\theta_{-x1-Gr}(x-2x1)$ of the two resultant projection images are expressed by the following formula (10).

[Formula 10]

$$\theta_{+x_1+Gr}(x) = \theta_{RF} + \Delta B_0 + (\theta_{AD} + \theta_+ + \alpha \cdot \theta_-)x + c_1 \\ \theta_{-x_1-Gr}(x - 2x_1) = \theta_{RF} + \Delta B_0 - (\theta_{AD} + \theta_- + \alpha \cdot \theta_+)x + c_9 \quad (10)$$

Accordingly, the aforementioned two projection images after the slice position alignment are added to cancel the phase rotation $\theta_{AD}$ caused by the signal misalignment during the A/D period.

[Formula 11]

$$\theta_{+x_1+Gr}(x) + \theta_{-x_1-Gr}(x-2x_1) = 2\theta_{RF} + 2\Delta B_0 + (\theta_+ - \theta_-)(1-\alpha) \\ x + c_{10}\alpha(\Delta t_{GC+} - \Delta t_{GC-})x \quad (11)$$

The result of addition of the projection images is expressed by the formula (11), indicating that the phase rotation $\theta_{RF}$ unique to probe and the phase rotation $\Delta B_0$ caused by ununiformity in the static magnetic field are not cancelled. If those values are small enough to be uninfluential to the detection, the slope of the phase of a result of addition with respect to the x-axis of the addition result corresponds to the drive timing misalignment between the positive-side and the negative-side magnetic field gradient subcoils. Therefore, likewise the first embodiment as described above, the measurement is executed a plurality of times while changing the drive timing of any one of the positive-side and the negative-side subcoils by a predetermined time width. The respective results of the measurement performed a plurality of times are used to obtain each slope of the addition result of the projection images of the echoes Nos. 1 and 2 before and after shifting. The obtained slope values are used to compute the time alignment corresponding to the slope of the phase equivalent to zero.

In the modified example of the embodiment, the influence of the misalignment during the A/D period is eliminated through the simple procedure to allow detection of the drive timing misalignment between the positive-side and the negative-side magnetic field gradient subcoils without employing the additional measurement device. It is therefore possible to adjust the drive timing misalignment.

INDUSTRIAL APPLICABILITY

The present invention allows accurate adjustment of the drive timing of the MRI system for performing parallel driving of the magnetic field gradient appropriately. This makes it possible to realize high image quality of the MRI system as well as maintain the high level of the image quality. The present invention is, thus expected to be widely distributed.

LIST OF REFERENCE SIGNS

101: magnet for generating static magnetic field
102: magnetic field gradient coil
103: subject
104: sequencer
105: magnetic field gradient power source
106: high frequency magnetic field generator
107: probe
108: receiver
109: computing unit
110: display
111: storage medium
112: time adjustment circuit

The invention claimed is:

1. A magnetic resonance imaging device comprising:
a magnet configured to generate a static magnetic field in a predetermined direction in a predetermined inspection space;
a magnetic field gradient generator configured to generate magnetic field gradients in three directions, and impart a gradient to a magnetic field intensity in the inspection space along each of three axes orthogonal to one another;
a probe configured to apply a high frequency magnetic field to a subject laid in the inspection space;
a sequencer configured to control the generation of the magnetic field gradients in the three directions, application of the high frequency magnetic field to the subject, and reception of a magnetic resonance signal generated from the subject by the probe; and
a processor programmed to process the detected magnetic resonance signal,
wherein the magnetic field gradient generator includes a positive-side subcoil and a negative-side subcoil for generating the magnetic field gradients in the three directions through composition, and power sources each for supplying current to the positive-side subcoil and the negative-side subcoil,
wherein the sequencer is configured to execute a plurality of pulse sequences used for detecting a drive timing misalignment between the positive-side subcoil and the negative-side subcoil, generate the magnetic field gradient in a first direction among the three directions through composition, and measure an echo of one of a first slice at a position shifted to the positive-side subcoil from an origin of the magnetic field gradient, and a second slice at a position shifted to the negative-side subcoil from the origin under a read-out magnetic field gradient pulse in the first direction, and wherein the processor is programmed to determine the drive timing misalignment between the positive-side subcoil and the negative-side subcoil by deriving projection images of the first slice and the second slice from application of an inverse-Fourier transformation on echo signals measured by the pulse sequences, obtain a phase difference between the projection images of the first slice and the second slice, and compute a change width of a drive timing of one of the positive-side subcoil and the negative-side subcoil which reduces a slope of the phase difference with respect to a location along the first direction to zero.

2. The magnetic resonance imaging device according to claim 1,
wherein the sequencer is configured to:
execute a first pulse sequence to excite a spin of the first slice through simultaneous application of a slice magnetic field gradient pulse in the first direction and an excitation pulse at a center frequency negatively shifted from a Larmor frequency corresponding to a static magnetic field intensity, and measure an echo of the excited spin under the read-out magnetic field gradient pulse, and
execute a second pulse sequence to excite a spin of the second slice similar to the first pulse sequence besides the excitation pulse at a center frequency positively shifted from the Larmor frequency, and measure an echo of the excited spin under the read-out magnetic field gradient pulse, and
wherein the processor is programmed to derive the first and the second projection images through application of the inverse-Fourier transformation on the echo signals derived from the first and the second pulse sequences, and execute a computation of the projection images through a difference process between the first and the second projection images after aligning slice positions thereof.

3. The magnetic resonance imaging device according to claim 1,
wherein the sequencer is configured to:
execute a first pulse sequence to excite a spin of the first slice through simultaneous application of a slice magnetic field gradient pulse in the first direction and an excitation pulse at a center frequency shifted from a Larmor frequency corresponding to a static magnetic field intensity, and measure an echo of the excited spin under the read-out magnetic field gradient pulse, and
execute a second pulse sequence for exciting a spin of the second slice similar to the first pulse sequence besides inversion of polarities between the slice magnetic field gradient pulse and the read-out magnetic field gradient pulse, and measure an echo of the excited spin under the read-out magnetic field gradient pulse, and
wherein the processor is programmed to derive the first and the second projection images through application of the inverse-Fourier transformation on the echo signals derived from the first and the second pulse sequences, and execute a computation of the projection images through an addition process of the first and the second projection images after aligning slice positions thereof.

4. The magnetic resonance imaging device according to claim 1,
wherein the sequencer is configured to:

execute a first pulse sequence to excite a spin of the first slice through simultaneous application of a slice magnetic field gradient pulse with negative polarity in the first direction and an excitation pulse at a center frequency negatively shifted from a Larmor frequency corresponding to a static magnetic field intensity, and measure an echo of the excited spin under the read-out magnetic field gradient pulse with positive polarity, execute a second pulse sequence to excite a spin of the second slice through simultaneous application of the slice magnetic field gradient pulse with positive polarity in the first direction and the excitation pulse at the center frequency negatively shifted from the Larmor frequency corresponding to the static magnetic field intensity, and measure an echo of the excited spin under the read-out magnetic field gradient with negative polarity, execute a third pulse sequence to excite a spin of the first slice through simultaneous application of the slice magnetic field gradient pulse with positive polarity in the first direction and the excitation pulse at the center frequency positively shifted from the Larmor frequency corresponding to the static magnetic field intensity, and measure an echo of the excited spin under the read-out magnetic field gradient with negative polarity, and execute a fourth pulse sequence to excite a spin of the second slice through simultaneous application of the slice magnetic field gradient pulse with negative polarity in the first direction and the excitation pulse at the center frequency positively shifted from the Larmor frequency corresponding to the static magnetic field intensity, and measure an echo of the excited spin under the read-out magnetic field gradient with positive polarity, and wherein the processor is programmed to:

execute a first difference process of the projection images between the echo derived from the first pulse sequence and the echo derived from the third pulse sequence in order to obtain a projection image of the first slice where a phase rotation caused by non-uniformity in the static magnetic field is eliminated, execute a second difference process of the projection images between the echo derived from the fourth pulse sequence and the echo derived from the second pulse sequence in order to obtain a projection image of the second slice where a phase rotation caused by non-uniformity in the static magnetic field is eliminated, and execute an alignment procedure between the measured slice positions as results of the first and the second difference processes for further executing the difference process in order to obtain the phase difference between the projection image of the first slice and the projection image of the second slice.

5. The magnetic resonance imaging device according to claim 1, wherein each path for transmitting control signals from the sequencer to the power sources of the positive-side and the negative-side subcoils is provided with a time adjustment unit configured to adjust a delay time of the subcoil with respect to an applied drive waveform, and wherein the sequencer is configured to execute a plurality of pulse sequences repeatedly in order to detect the drive timing misalignment existing between the positive-side subcoil and the negative-side subcoil while changing the delay time of the drive waveform of either the positive-side subcoil or the negative-side subcoil into a plurality of values, and wherein the processor is programmed to:

obtain a relationship of each value of the plurality of values of the delay time with respect to the slope of the phase difference between the projection image of the first slice and the projection image of the second slice, and determine the delay time at which the slope becomes zero as the drive timing misalignment between the positive-side subcoil and the negative-side subcoil.

6. The magnetic resonance imaging device according to claim 5, further comprising:

a unit for setting the drive timing in order to correct the determined misalignment between the positive-side subcoil and the negative-side subcoil obtained by the processor connected to the time adjustment unit.

7. A method of detecting a timing misalignment of a magnetic resonance imaging device, where the magnetic resonance imaging device includes a magnet to generate a static magnetic field in a predetermined direction in a predetermined inspection space, a magnetic field gradient generator to generate magnetic field gradients in three directions, impart a gradient to a magnetic field intensity in the inspection space along each of three axes orthogonal to one another by combining the magnetic fields generated by a positive-side subcoil and a negative-side subcoil, a probe to apply a high frequency magnetic field to a subject laid in the inspection space, a sequencer to control generation of the magnetic field gradients in the three directions, application of the high frequency magnetic field to the subject, and reception of a magnetic resonance signal generated from the subject by the probe, and a processor to process the detected magnetic resonance signal so as to detect a drive timing misalignment between the positive-side subcoil and the negative-side subcoil, the method comprising the steps of:

executing a plurality of pulse sequences for measuring an echo of one of a first slice at a location shifted to the positive-side subcoil from an origin of the magnetic field gradient and a second slice shifted to the negative-side subcoil from the origin under the read-out magnetic field gradient pulse in a first direction generated by the positive-side subcoil and the negative-side subcoil for an inspection;

deriving a plurality of projection images of the first slice and the second slice by applying an inverse-Fourier transformation on echo signals measured through execution of the pulse sequences;

obtaining a phase difference between the derived projection images of the first slice and the second slice; and computing a change width of the drive timing of one of the positive-side subcoil and the negative-side subcoil to reduce a slope of the phase difference with respect to a location along the first direction to zero, and determining the computed change width as the drive timing misalignment between the positive-side subcoil and the negative-side subcoil.

8. The method of detecting a timing misalignment of the magnetic resonance imaging device according to claim 7, wherein the execution of the pulse sequences includes:

executing a first pulse sequence to excite a spin of the first slice through simultaneous application of a slice magnetic field gradient pulse in the first direction and an excitation pulse at a center frequency negatively shifted from a Larmor frequency corresponding to a static magnetic field intensity, and measuring an echo of the excited spin under the read-out magnetic field gradient pulse, and executing a second pulse sequence to excite a spin of the second slice similar to the first pulse sequence besides the excitation pulse at a center frequency positively shifted from the Larmor frequency, and measuring an echo of the excited spin under the read-out magnetic field gradient pulse, and wherein the processor derives the first and the second projection images through application of the inverse-Fourier transformation on the echo signals derived from the first and the second pulse sequences, and executes a computation of the projection images through a difference process between the first and the second projection images after aligning slice positions thereof.

9. The method of detecting a timing misalignment of a magnetic resonance imaging device according to claim 7, wherein the execution of the pulse sequences include:

executing a first pulse sequence to excite a spin of the first slice through simultaneous application of a slice magnetic field gradient pulse in the first direction and an excitation pulse at a center frequency shifted from a Larmor frequency corresponding to a static magnetic field intensity, and measuring an echo of the excited spin under the read-out magnetic field gradient pulse, and executing a second pulse sequence to excite a spin of the second slice similar to the first pulse sequence besides inversion of polarities between the slice magnetic field gradient pulse and the read-out magnetic field gradient pulse, and measuring an echo of the excited spin under the read-out magnetic field gradient pulse with inverted polarity, and wherein the processor derives the first and the second projection images through application of the inverse-Fourier transformation on the echo signals derived from the first and the second pulse sequences, and executes a computation of the projection images through an addition process of the first and the second projection images after aligning slice positions thereof.

10. The method of detecting a timing misalignment of a magnetic resonance imaging device according to claim 7, wherein the execution of the pulse sequences includes:

executing a first pulse sequence to excite a spin of the first slice through simultaneous application of a slice magnetic field gradient pulse with negative polarity in the first direction and an excitation pulse at a center frequency negatively shifted from a Larmor frequency corresponding to the static magnetic field intensity, and measuring an echo of the excited spin under the read-out magnetic field gradient pulse with positive polarity, executing a second pulse sequence to excite a spin of the second slice through simultaneous application of the slice magnetic field gradient pulse with positive polarity in the first direction and the excitation pulse at the center frequency positively shifted from the Larmor frequency corresponding to the static magnetic field intensity, and measuring an echo of the excited spin under the read-out magnetic field gradient with negative polarity, executing a third pulse sequence to excite a spin of the first slice through simultaneous application of the slice magnetic field gradient pulse with positive polarity in the first direction and the excitation pulse at the center frequency negatively shifted from the Larmor frequency corresponding to the static magnetic field intensity, and measuring an echo of the excited spin under the read-out magnetic field gradient with negative polarity, and executing a fourth pulse sequence to excite a spin of the second slice through simultaneous application of the slice magnetic field gradient pulse with negative polarity in the first direction and the excitation pulse at the center frequency positively shifted from the Larmor frequency corresponding to the static magnetic field intensity, and measuring an echo of the excited spin under the read-out magnetic field gradient with positive polarity, and wherein the processor:

executes a first difference process on the derived projection images between the echo derived from the first pulse sequence and the echo derived from the third pulse sequence in order to obtain a projection image of the first slice that has eliminated a phase rotation caused by non-uniformity in the static magnetic field, executes a second difference process on the derived projection images between the echo derived from the fourth pulse sequence and the echo derived from the second pulse sequence in order to obtain a projection image of the second slice that has eliminated a phase rotation caused by non-uniformity in the static magnetic field, and executes an alignment procedure between the measured slice positions as results of the first and the second difference processes for further executing the difference process in order to obtain the phase difference between the projection image of the first slice and the projection image of the second slice.

* * * * *